United States Patent
Tsang et al.

(10) Patent No.: US 7,940,129 B1
(45) Date of Patent: May 10, 2011

(54) LOW KVCO PHASE-LOCKED LOOP WITH LARGE FREQUENCY DRIFT HANDLING CAPABILITY

(75) Inventors: Randy Tsang, Foster City, CA (US); Yu-chi Lee, Cupertino, CA (US); David Cousinard, Morges (SZ)

(73) Assignee: Marvell International Ltd., Hamilton (BM)

( * ) Notice: Subject to any disclaimer, the term of this patent is extended or adjusted under 35 U.S.C. 154(b) by 51 days.

(21) Appl. No.: 12/431,195

(22) Filed: Apr. 28, 2009

Related U.S. Application Data

(60) Provisional application No. 61/055,047, filed on May 21, 2008.

(51) Int. Cl.
*H03L 7/085* (2006.01)
(52) U.S. Cl. .............................. 331/17; 331/34; 331/179
(58) Field of Classification Search ............... 331/17, 331/34, 179
See application file for complete search history.

(56) References Cited

U.S. PATENT DOCUMENTS

| | | | |
|---|---|---|---|
| 2003/0001679 A1* | 1/2003 | Lever | 331/11 |
| 2003/0222722 A1* | 12/2003 | Kwon | 331/17 |

* cited by examiner

*Primary Examiner* — Joseph Chang

(57) ABSTRACT

A phase-locked loop that supports a large frequency drift capability, yet maintains a low Kvco, and does not introduce noise or discontinuities in the frequency of the generated phase-locked loop output signal. The phase-locked loop may include a VCO with an LC tank circuit, the capacitance of which may be adjusted in incremental units. By gradually adjusting a control signal applied to a selected VCO LC tank circuit frequency adjustment control line, e.g., in a continuous ramped function, or time-averaged ramped function, from LOW-to-HIGH or from HIGH-to-LOW, over a period of time that is greater than the response time of the phase-locked loop, a frequency range supported by the VCO may be shifted to either a higher frequency range or a lower frequency range, as needed, to accommodate environmentally induced frequency drift in the VCO, without introducing noise or discontinuities in the frequency of the generated phase-locked loop output signal.

20 Claims, 6 Drawing Sheets

LOW KVCO PHASE-LOCKED LOOP WITH LARGE FREQUENCY DRIFT HANDLING CAPABILITY

INCORPORATION BY REFERENCE

This application claims the benefit of U.S. Provisional Application No. 61/055,047, "LOW KVCO PLL WITH LARGE FREQUENCY DRIFT HANDLING CAPABILITY," filed by Randy P. Tsang, Yu-Chi Lee, and David Cousinard on May 21, 2008, which is incorporated herein by reference in its entirety.

BACKGROUND

A wide range of electronic circuits and devices, such as cellular phones, GPS devices, and other systems, require the presence of a continuous clock signal with a constant clock frequency. A clock frequency generating unit should be able to automatically correct frequency drifts in a generated clock frequency without producing an intolerable frequency error, at all times, including the time at which corrections are performed.

One widely used approach for generating a self-correcting clock frequency includes use of a phase-locked loop. One of the components in the phase-locked loop is the voltage controlled oscillator (VCO). However, a VCO oscillating frequency exhibits a dependence on temperature or other environmental stress, which causes the frequency of a signal generated by a VCO to drift in accordance with changes in the VCO's operational temperature, or other environmental stresses.

However, because the VCO in a phase-locked loop is enclosed in a feedback loop in which the VCO frequency is locked to a stable reference clock frequency, the VCO frequency can be adjusted by the control loop, automatically, and compensate for the frequency drift of the VCO as long as the loop response time is shorter than the rate of temperature change or other environmental changes and the frequency drift is within the VCO's correctable range.

The frequency of a signal generated by a VCO in response to an input control voltage can be adjusted by changing the capacitance value of an inductance/capacitance (LC) tank circuit included in the VCO. The value of the capacitance can be changed by either adjusting the value of a varactor, or by adjusting the number of discrete capacitor bank units connecting to the tank circuit. In the case where the frequency is adjusted through a continuously tunable varactor, the range of VCO frequency that such compensation can achieve is limited by the Kvco, i.e., the sensitivity of VCO frequency change to control signal change, and the range of the control signal. The control signal range is limited by the supply voltage and other components in the PLL. As operating supply voltage decreases, its control signal range reduces.

In order to cover the expected frequency drift of the VCO over an expected operational temperature range, the Kvco may be increased. However, increasing the Kvco constrains the minimum value of the Kvco, adversely affects the phase noise performance and indirectly affects other performance metrics of the PLL. In cases in which the frequency is adjusted by switching in or out discrete units of capacitance, an instantaneous jump in frequency will occur and this will create an instantaneous frequency error that will be corrected by the PLL over time. However, the relative large frequency jump at the beginning of the capacitance adjustment is typically too large for practical implementation and is proven to be unacceptable by most applications.

Hence, a need exists for a phase-locked loop that supports a large frequency drift capability, yet maintains a low Kvco, and does not introduce noise or discontinuities in the frequency of the generated phase-locked loop output signal.

SUMMARY

Aspects of this disclosure can provide a phase-locked loop, and method of operation, that supports a large VCO frequency drift correction capability, yet maintains a low Kvco, and does not introduce noise or discontinuities in the frequency of the generated phase-locked loop output signal. The phase-locked loop may include a VCO with an LC tank circuit, the capacitance of which may be adjusted in incremental units using LC tank circuit frequency adjustment control lines. Each tank circuit frequency adjustment control line may be used to either include, or not include, a unit of capacitance within the LC tank circuit, thereby allowing each tank circuit frequency adjustment control line to adjust the total capacitance of the LC tank unit by plus or minus a predetermined unit of capacitance, $\pm \Delta C$. For example, increasing the capacitance value of an inductance/capacitance (LC) tank circuit included in a VCO by a predetermined unit of capacitance, $+\Delta C$, may decrease the Kvco of the VCO, i.e., the sensitivity of VCO frequency change to control signal change and, therefore, may decrease the frequency of a signal generated by the VCO in response to an input control voltage. Decreasing the capacitance value of an inductance/capacitance (LC) tank circuit included in a VCO by a predetermined unit of capacitance, $-\Delta C$, may increase the Kvco of the VCO and, therefore, may increase the frequency of a signal generated by a VCO in response to the same input control voltage.

By gradually adjusting a control signal applied to each respectively selected VCO LC tank circuit frequency adjustment control line, e.g., in a continuous ramped function, or time-averaged ramped function, from LOW-to-HIGH or from HIGH-to-LOW over a period of time that is greater than the response time of the phase-locked loop circuit, a frequency range supported by the VCO may be shifted to either a higher frequency range or a lower frequency range, as needed, to accommodate environmentally induced frequency drift in the VCO, without introducing noise or discontinuities in the frequency of the generated phase-locked loop output signal, thus greatly extending the frequency drift range that can be automatically corrected by the phase-locked loop.

In one example embodiment a phase-locked loop circuit is described that may include, a VCO frequency compensation control unit that may generate a VCO frequency adjustment signal based on a measure of frequency difference between a reference signal and a VCO feedback signal, and a VCO that may receive the VCO frequency adjustment signal and may adjust a frequency of a signal generated by the VCO based on the received VCO frequency adjustment signal, in which the VCO frequency adjustment signal is ramped over an adjustment period that is greater than a response time of the phase-locked loop circuit.

In another example embodiment, a method of adjusting the frequency of a signal generated by a VCO in a phase-locked loop is described that may include, generating a VCO frequency adjustment signal based on a reference signal and a VCO feedback signal, and adjusting a frequency of the signal generated by the VCO based on the VCO frequency adjustment signal, in which the VCO frequency adjustment signal is ramped over an adjustment period that is greater than a response time of the phase-locked loop circuit.

In yet another example embodiment, a method of increasing a range of frequency drift in a VCO that may be corrected by a phase-locked loop circuit containing the VCO is described that may include, generating a measure of frequency difference between a reference signal and a VCO feedback signal, generating a VCO frequency adjustment signal based on the measure of frequency difference, and adjusting a capacitance of an LC tank circuit within the VCO based on the VCO frequency adjustment signal, in which the VCO frequency adjustment signal is ramped over an adjustment period that is greater than a response time of the phase-locked loop circuit.

BRIEF DESCRIPTION OF THE DRAWINGS

Example embodiments of a low Kvco phase-locked loop (PLL) with large frequency drift handling capability will be described with reference to the following drawings, wherein like numerals designate like elements, and wherein.

DETAILED DESCRIPTION OF EMBODIMENTS

Figure 1:
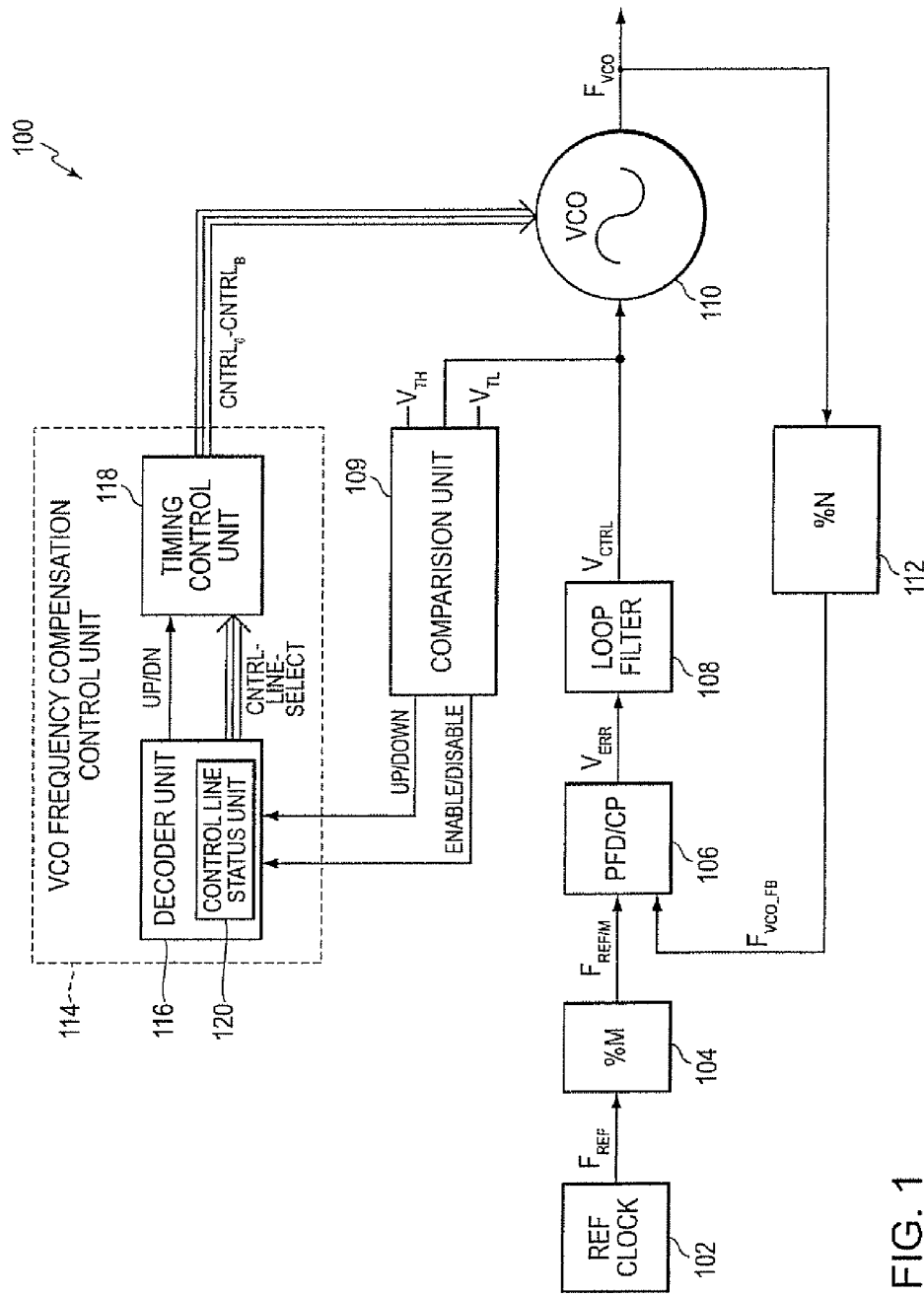
FIG. 1 is a block diagram of an example phase-locked loop circuit with a VCO frequency compensation control unit that includes an example frequency compensation control signal timing control unit.

FIG. 1 is a block diagram of an example phase-locked loop circuit with a VCO frequency compensation control unit that includes an example frequency compensation control signal timing control unit. The phase-locked loop circuit of FIG. 1 may be included in any electronic device, e.g., radios, cell phones, GPS devices, etc., that requires a stable clock signal despite changes in operating temperatures, and/or other factors that may otherwise induce frequency drift. As shown in FIG. 1, phase-locked loop circuit 100 may include a reference clock 102, e.g., a crystal oscillator, a reference signal frequency divider 104, a phase-frequency detector/charge pump 106, a loop filter 108, a comparison unit 109, a voltage-controlled oscillator (VCO) 110, a feedback signal frequency divider 112, and a VCO frequency compensation control unit 114 that may include a decoder unit 116 and VCO frequency compensation control signal timing control unit 118. Decoder unit 116 may include a control line status unit 120.

In operation, reference clock 102 can generate a clock reference signal ($F_{REF}$) that may be passed to reference signal frequency divider 104. Reference signal frequency divider 104 can divide the frequency of clock reference signal ($F_{REF}$) by a predetermined divider, e.g., M, to produce a reference input signal ($F_{REF/M}$) that may be passed to phase-frequency detector/charge pump 106. Phase-frequency detector/charge pump 106 can compare the received reference input signal ($F_{REF/M}$) with a received VCO feedback signal ($F_{VCO\_FB}$) and may generate a frequency error signal ($V_{ERR}$), that may be representative in both sign and scale to the frequency difference detected by phase-frequency detector/charge pump 106 between reference input signal ($F_{REF/M}$) and VCO feedback signal ($F_{VCO\_FB}$). Loop filter 108 can receive and integrate frequency error signal ($V_{ERR}$) to generate a smoothed VCO control signal ($V_{CTRL}$) that may be passed to voltage controlled oscillator 110, resulting in the generation of a VCO output signal ($F_{VCO}$) with a frequency that is proportional to VCO control signal ($V_{CTRL}$). VCO output signal ($F_{VCO}$) can be passed to feedback signal frequency divider 112, which may divide the frequency of VCO output signal ($F_{VCO}$) by a predetermined divider, e.g., N, to produce VCO feedback signal ($F_{VCO\_FB}$) that may be passed to phase-frequency detector/charge pump 106, as described above.

Further, as described in greater detail below, the frequency of VCO output signal ($F_{VCO}$) can be controlled by VCO frequency compensation control unit 114, based on feedback signals generated, for example, either directly, or indirectly, by phase-frequency detector/charge pump 106. For example, in one example embodiment, comparison unit 109 may compare the VCO control signal ($V_{CTRL}$) with a low threshold voltage ($V_{TL}$) and a high threshold voltage ($V_{TH}$) and may generate control signals based on whether the VCO control signal ($V_{CTRL}$) is above, below or in-between the two thresholds. For example, in one example embodiment, if the VCO control signal ($V_{CTRL}$) is above the high threshold voltage ($V_{TH}$), comparison unit 109 may simultaneously pass an UP signal and an ENABLE signal to VCO frequency compensation control unit 114, to instruct VCO frequency compensation control unit 114 to increase the frequency of the VCO output signal ($F_{VCO}$), e.g., by a predetermine amount, generated by voltage controlled oscillator 110 in response to a VCO control signal ($V_{CTRL}$) received from loop filter 108. If the VCO control signal ($V_{CTRL}$) is below the low threshold voltage ($V_{TL}$), comparison unit 109 may simultaneously pass a DOWN signal and an ENABLE signal to VCO frequency compensation control unit 114, to instruct VCO frequency compensation control unit 114 to decrease the frequency of the VCO output signal ($F_{VCO}$), e.g., by a predetermine amount, generated by voltage controlled oscillator 110 in response to a VCO control signal ($V_{CTRL}$) received from loop filter 108. If the VCO control signal ($V_{CTRL}$) is between the low threshold voltage ($V_{TL}$) and the high threshold voltage ($V_{TH}$), comparison unit 109 may pass a DISABLE signal to VCO frequency compensation control unit 114, to instruct VCO frequency compensation control unit 114 to maintain the current frequency gain control settings.

For example, in one embodiment, the respective UP/DOWN and ENABLE/DISABLE signals may be received by VCO frequency compensation control unit 114 and used to adjust the signal values passed, for example, from VCO frequency compensation control unit 114 to voltage controlled oscillator 110 via VCO frequency control signal lines, e.g., $CNTRL_0$ though $CNTRL_B$, as shown in FIG. 1, that may control the frequency applied by voltage controlled oscillator 110 in response to a VCO control signal ($V_{CTRL}$) received from loop filter 108.

For example, as shown in FIG. 1, the respective UP/DOWN and ENABLE signals may be received by decoder unit 116 within VCO frequency compensation control unit 114. In such an example embodiment, decoder unit 116 can maintain a status table that indicates a status, e.g., LOW or HIGH, of each of VCO frequency control signal lines, e.g., $CNTRL_0$ though $CNTRL_B$. If decoder unit 116 receives a DOWN/ENABLE signal combination from comparison unit 109, decoder unit 116 can select a VCO frequency control signal line, e.g., from $CNTRL_0$ through $CNTRL_B$, with a control line status unit 120 status of LOW, which may indicate that the control line has a LOW signal applied to it by timing control unit 118. If decoder unit 116 receives an UP/ENABLE signal combination from comparison unit 109, decoder unit 116 can select a VCO frequency control signal line, e.g., from $CNTRL_B$ through $CNTRL_B$, with a control line status unit 120 status of HIGH, which may indicate that the control line has a HIGH signal applied to it by timing control unit 118. Upon selecting a VCO frequency control signal line, decoder unit 116 may update the stored status for the selected VCO frequency control signal line in control line status unit 120, e.g., from LOW to HIGH or from HIGH to LOW, respectively, and may provide timing control unit 118 with the received UP/DOWN signal and the identity of the selected VCO frequency control signal line.

For example, as shown in FIG. 1, and described below with respect to FIG. 6 and FIG. 7, decoder unit 116 may inform timing control unit 118 of the identity of a selected control line by setting a signal value on a lead between decoder unit 116 and timing control unit 118 corresponding to the selected control line, e.g., one of leads CNTRL_LINE_SELECT, as shown in FIG. 1, to HIGH. Further, upon changing a value on one of the CNTRL_LINE_SELECT leads from LOW to HIGH, decoder unit 116 may set the signal value on an UP/DOWN lead between decoder unit 116 and timing control unit 118 corresponding to the received UP/DOWN value received from comparison unit 109.

As described in greater detail below, timing control unit 118 may maintain one of a LOW and a HIGH signal value on each of VCO frequency control signal lines, e.g., $CNTRL_0$ through $CNTRL_B$, between timing control unit 118 and voltage controlled oscillator 110, based on a set of initial settings and subsequent status updates received from decoder unit 116. However, after initialization, upon detecting one of a change in the UP/DOWN status for a VCO frequency control signal line, or a change in the selected VCO frequency control signal line, from decoder unit 116, timing control unit 118 may initiate a gradual transition of the VCO frequency control signal applied to the identified VCO frequency control signal line to the new UP/DOWN status identified by decoder unit 116.

As described above, and as described in greater detail below, by gradually adjusting the signal applied to the VCO frequency control signal line over a period of time that is greater than the response time of phase-locked circuit 100, a frequency range supported by voltage controlled oscillator 110 in response to VCO control signal ($V_{CTRL}$) received from loop filter 108, may be shifted to either a higher frequency range or a lower frequency range, as needed to accommodate environmentally induced frequency drift in voltage controlled oscillator 110. In this manner, phase-locked loop circuit 100 may support a large frequency drift capability while maintaining a low Kvco.

It is noted that each of reference signal frequency divider 104, % M, and feedback signal frequency divider 112, % N, are optional. For example, feedback signal frequency divider 112, % N, may be inserted in the feedback loop to allow voltage controlled oscillator 110 to increase the VCO output signal ($F_{VCO}$) frequency above the reference input signal ($F_{REF/M}$) frequency. For example, in the example phase-locked loop shown in FIG. 1, the VCO output signal ($F_{VCO}$) frequency may be equal to (N) times the reference input signal ($F_{REF/M}$) frequency. By matching the feedback signal frequency divider 112, % N, to the increase in frequency applied by voltage-controlled oscillator 110 the VCO feedback signal ($F_{FB}$) frequency remains locked to the reference input signal ($F_{REF/M}$) frequency, as shown in equation 1, equation 2, and equation 3, below.

$$F_{REF/M}=F_{REF}/M \qquad \text{Eq. 1}$$

$$F_{VCO}=F_{REF/M} \times N = F_{REF} \times N/M \qquad \text{Eq. 2}$$

$$F_{VCO\_FB}=F_{VCO}/N=F_{REF}/M \qquad \text{Eq. 3}$$

Further, as demonstrated by equation 2, above, it is noted that inserting optional reference signal frequency divider 104, % M, prior to the feedback loop allows the phase-locked loop circuit 100 to generate a VCO output signal ($F_{VCO}$) with a frequency that is proportional to the clock reference signal ($F_{REF}$), as determined by the ratios of the two optional dividers, N and M. However, if the phase-locked loop circuit 100 is to be used to lock the frequency of VCO output signal ($F_{VCO}$) to the frequency of clock reference signal ($F_{REF}$), neither optional reference signal frequency divider 104 or optional feedback signal frequency divider 112 are required.

Figure 2:
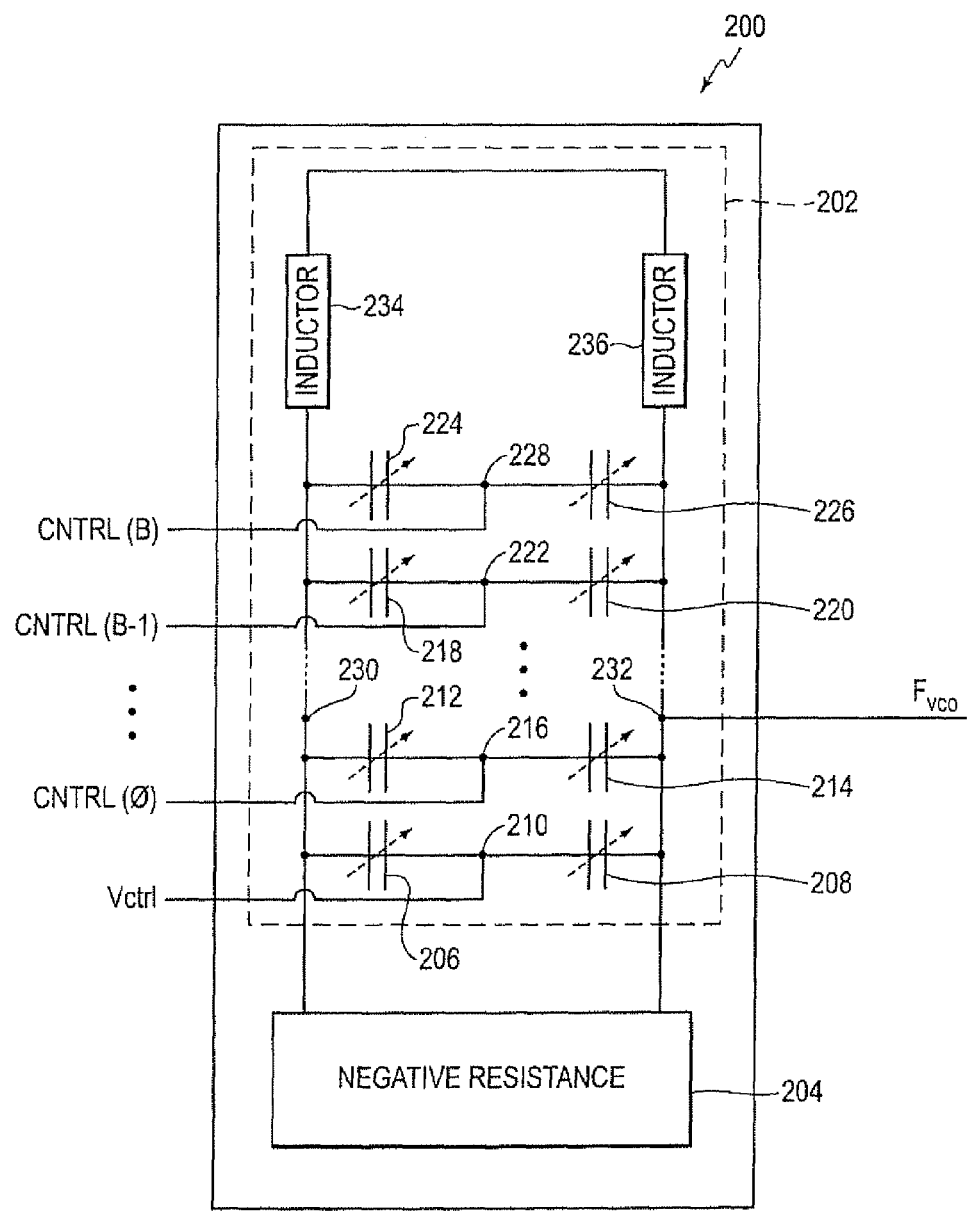
FIG. 2 is a circuit diagram of a first example VCO that may be controlled using an embodiment of the VCO frequency compensation control unit introduced in FIG. 1.

FIG. 2 is a circuit diagram of a first example embodiment of a voltage controlled oscillator that may be controlled using an embodiment of the VCO frequency compensation control unit described above with respect to FIG. 1. For example, voltage controlled oscillator 200 can be an inductance-capacitance (LC) tank oscillator that uses negative resistance to achieve oscillation. As shown in FIG. 2, voltage controlled oscillator 200 can include an LC tank circuit 202 and a negative resistance unit 204. As further shown in FIG. 2, LC tank circuit 202 can include a first node 230 and a second node 232 that may be spanned by a plurality of parallel capacitive circuit branches and an inductive circuit branch arranged in parallel with the capacitive circuit branches. An example capacitive circuit branch may include a pair of varactors, arranged in series with a control lead connected to the capacitive circuit branch at a node between the respective varactors. An example inductive circuit branch may include a pair of inductors arranged in series.

As shown in FIG. 2, LC tank circuit 202 may include a capacitive circuit branch with varactor 206, varactor 208 and center node 210 to which VCO control signal ($V_{CTRL}$) line may be attached, and may include a capacitive circuit branch to which each of VCO frequency control signal lines, e.g., $CNTRL_0$ though $CNTRL_B$, may be attached. For example, as shown in FIG. 2, a capacitive circuit branch for VCO frequency control signal line $CNTRL_0$ may include varactor 212, varactor 214 and center node 216 to which VCO frequency control signal line $CNTRL_0$ may be attached; a capacitive circuit branch for VCO frequency control signal line $CNTRL_{B-1}$ may include varactor 218, varactor 220 and center node 222 to which VCO frequency control signal line $CNTRL_{B-1}$ may be attached; and a capacitive circuit branch for VCO frequency control signal line $CNTRL_B$ may include varactor 224, varactor 226 and center node 228 to which VCO frequency control signal line $CNTRL_B$ may be attached.

In such an example voltage controlled oscillator, voltage controlled oscillator 200 may oscillate so long as the total resistance in the loop formed by inductor 236, inductor 239 and negative resistance 204 is negative. For example, voltage controlled oscillator 200 may oscillate if the real part of the input impedance of components in negative resistance 204 is sufficiently negative to yield an overall negative resistance for the loop. Further, each of the varactors included in the respective capacitive circuit branches in voltage controlled oscillator 200 may provide a low, e.g. near zero, capacitance upon application of a LOW voltage control signal on the respective capacitive circuit branch control lead, may provide a predetermined capacitance upon application of a HIGH voltage control signal on the respective capacitive circuit branch control lead, and may provide capacitance proportional to the applied control voltage signal in response to application of a control signal with a magnitude between the LOW voltage control signal and the HIGH voltage control signal.

In operation, such an example voltage controlled oscillator 200 may be initialized such that half of the VCO frequency control signal lines, e.g., $CNTRL_0$ though $CNTRL_N$, may be initialized by VCO frequency compensation control unit 114, to a HIGH voltage control signal, half of the VCO frequency control signal lines, e.g., $CNTRL_{N+1}$ though $CNTRL_B$, may be initialized by VCO frequency compensation control unit 114, to a LOW voltage control signal, and the VCO control signal ($V_{CTRL}$) line may set to a predetermined determined mid-range voltage control signal. In subsequent cycles of phase-locked circuit 200, however, the signal applied to the VCO control signal ($V_{CTRL}$) line may be adjusted by loop filter 108 based on the $V_{ERR}$ signal generated by phase-frequency detector/charge pump 106 based on the determined frequency difference between reference input signal ($F_{REF/M}$) with a received VCO feedback signal ($F_{VCO\_FB}$), as described above. Further, if in subsequent cycles of phase-locked circuit 200, comparison unit 109 detects that the control signal ($V_{CTRL}$) is below the low threshold voltage ($V_{TL}$), or above the high threshold voltage ($V_{TH}$), VCO frequency compensation control unit 114, may adjust the respective VCO frequency control signal lines, e.g., $CNTRL_0$ though $CNTRL_B$, based on the UP/DOWN signals generated by comparison unit 109, as described above.

As described above, and as described in greater detail below, by gradually adjusting the control signal applied to each respectively selected VCO frequency control signal line, e.g., in a continuous ramped function from HIGH-to-LOW or in a continuous ramped function from LOW-to-HIGH, in response to an received UP/DOWN signal, respectively, over a period of time that is greater than the response time of phase-locked circuit 100, a frequency range supported by voltage controlled oscillator 200 may be shifted to either a higher frequency range or a lower frequency range, as needed, to accommodate environmentally induced frequency drift in voltage controlled oscillator 200. In this manner, phase-locked loop circuit 100 may automatically correct VCO frequency drift over a larger total range, while maintaining a low Kvco, and without introducing noise or a discontinuity in the frequency of the generated VCO output signal ($F_{VCO}$).

Figure 3:
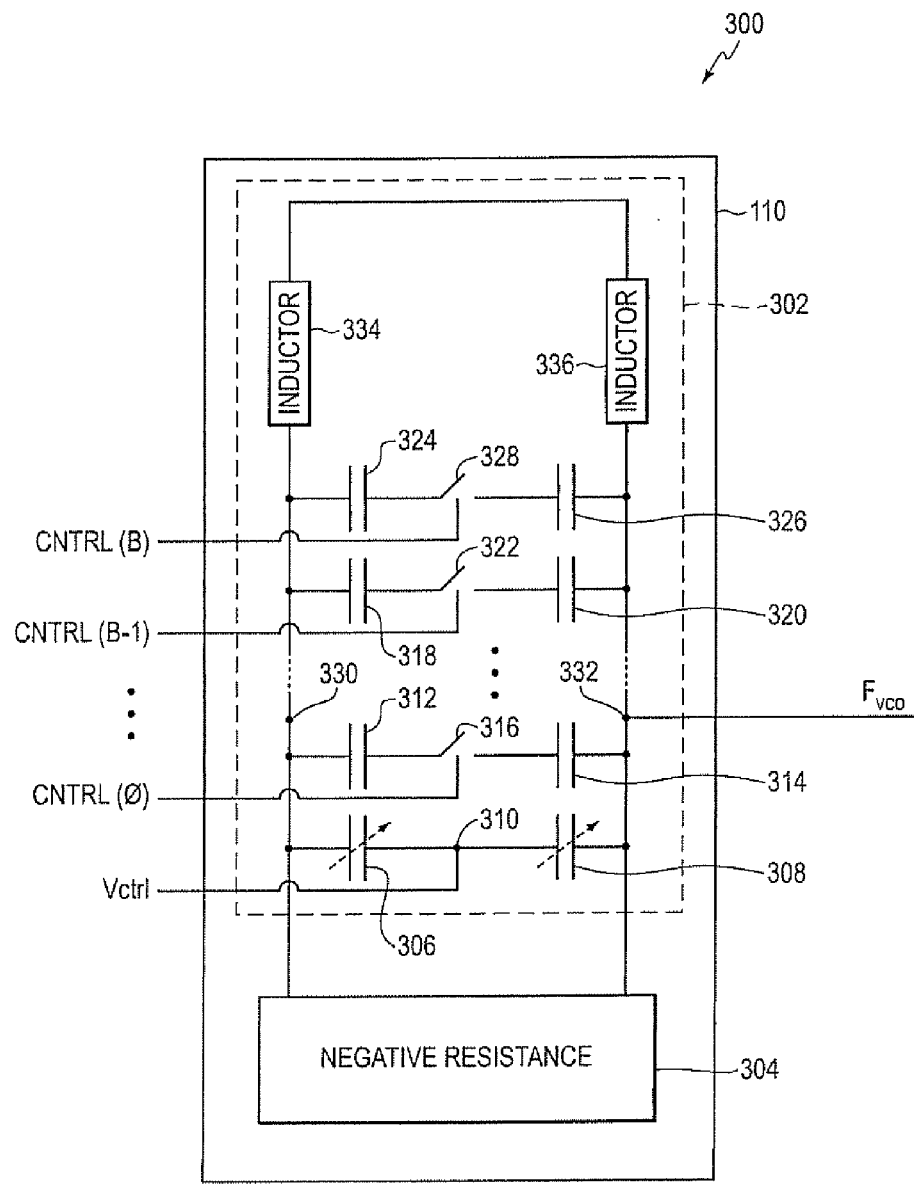
FIG. 3 is a circuit diagram of a second example VCO that may be controlled using an embodiment of the VCO frequency compensation control unit introduced in FIG. 1.

FIG. 3 is a circuit diagram of a second example embodiment of a voltage controlled oscillator that may be controlled using an embodiment of the VCO frequency compensation control unit described above with respect to FIG. 1. Similar to example inductance-capacitance (LC) tank voltage controlled oscillator 200 described above with respect to FIG. 2, the example inductance-capacitance (LC) tank voltage controlled oscillator 300 shown in FIG. 3, may use negative resistance to achieve oscillation. Specifically, voltage controlled oscillator 300 may include an LC tank circuit 302 and a negative resistance unit 304, and LC tank circuit 302 may include a first node 330 and a second node 332 that may be spanned by a plurality of parallel capacitive circuit branches and an inductive circuit branch. Further, the capacitive circuit branch to which the VCO control signal ($V_{CTRL}$) line may be attached may include a varactor based configuration, including a varactor 306, varactor 308 and center node 310 to which VCO control signal ($V_{CTRL}$) line may be attached.

However, different from voltage controlled oscillator 200, described above with respect to FIG. 2, the capacitive circuit branches in voltage controlled oscillator 300 that support each of VCO frequency control signal lines, $CNTRL_0$ though $CNTRL_B$ may use a pair of capacitors, e.g., a pair of metal insulator metal (MIM) capacitors or a pair of metal oxide metal (MOM) capacitors, in place of the pair of the varactors used in voltage controlled oscillator 200. Further, a transistor switch may be placed between and in series with the respective capacitors in each capacitive circuit branch, with each of the respective VCO frequency control signal lines connected to the control gate of each respective switch. Using such a configuration, the capacitors in each respective capacitive circuit branch may be included in LC tank circuit 302 by closing the respective transistor switch in each capacitive circuit branch, and may be removed from LC tank circuit 302 by opening the respective transistor switch in each capacitive circuit branch.

For example, as shown in FIG. 3, LC tank circuit 302 can include a capacitive circuit branch with varactor 306, varactor 308 and center node 310 to which VCO control signal ($V_{CTRL}$) line may be attached, and may include a capacitive circuit branch to which each of VCO frequency control signal lines, $CNTRL_0$ though $CNTRL_B$, may be attached. For example, as shown in FIG. 3, a capacitive circuit branch for VCO frequency control signal line $CNTRL_0$ may include capacitor 312, capacitor 314 and in-series center transistor 316, to the gate of which VCO frequency control signal line $CNTRL_0$ may be attached; a capacitive circuit branch for VCO frequency control signal line $CNTRL_{B-1}$ may include capacitor 318, capacitor 320 and an in-series center transistor 322, to the gate of which VCO frequency control signal line $CNTRL_{B-1}$ may be attached; and a capacitive circuit branch for VCO frequency control signal line $CNTRL_B$ may include capacitor 324, capacitor 326 and center transistor 328, to the gate of which VCO frequency control signal line $CNTRL_B$ may be attached.

In such an embodiment, voltage controlled oscillator 300 may oscillate so long as the total resistance in the loop formed by inductor 334, inductor 336 and negative resistance 304 is negative. For example, voltage controlled oscillator 300 may oscillate if the real part of the input impedance of components in negative resistance 304 is sufficiently negative to yield an overall negative resistance for the loop. Further, each of the capacitors included in the respective capacitive circuit branches in voltage controlled oscillator 300 contribute zero capacitance to the circuit when the respective in-series center transistors are open, and contribute a predetermined capacitance to the circuit when the respective in-series center transistors are closed.

In operation, voltage controlled oscillator 300 may be initialized such that half of the VCO frequency control signal lines, e.g., $CNTRL_0$ though $CNTRL_N$, may be initialized by VCO frequency compensation control unit 114, to close the respective in-series center transistors, and half of the VCO frequency control signal lines, e.g., $CNTRL_{N+1}$ though $CNTRL_B$, may be initialized by VCO frequency compensation control unit 114, to open the respective in-series center transistors, and the VCO control signal ($V_{CTRL}$) line may set to a predetermined determined mid-range voltage control signal. In subsequent cycles of phase-locked circuit 300, however, the signal applied to the VCO control signal ($V_{CTRL}$) line may be adjusted by loop filter 108 based on the $V_{ERR}$ signal generated by phase-frequency detector/charge pump 106 based on the determined frequency difference between reference input signal ($F_{REF/M}$) with a received VCO feedback signal ($F_{VCO\_FB}$), as described above. Further, if in subsequent cycles of phase-locked circuit 300, comparison unit 109 should detect that control signal ($V_{CTRL}$) is below the low threshold voltage ($V_{TL}$), or above the high threshold voltage ($V_{TH}$), VCO frequency compensation control unit 114, may adjust the respective VCO frequency control signal lines, e.g., $CNTRL_0$ though $CNTRL_B$, based on the UP/DOWN signals generated by comparison unit 109, as described above.

In operation, a major difference between voltage controlled oscillator 300, described with respect to FIG. 3, and voltage controlled oscillator 200, described with respect to FIG. 2, is the impact of the use of MOM/MIM capacitors and open/close switches in voltage controlled oscillator 300, in place of the variably controlled varactors used in voltage controlled oscillator 200. For example, by closing a capacitive branch in-series transistor, the capacitance of the branch is suddenly added to the circuit. Such a sudden change in the capacitance of LC tank circuit 302, if left uncorrected, may introduce noise and/or an operationally disruptive discontinuity in the frequency of the generated VCO output signal ($F_{VCO}$). Fortunately, by configuring timing control unit 118 to apply a VCO frequency control signal to a VCO frequency control signal line in, for example, a pulse-modulated manner, such that the time averaged change in LC tank capacitance, during the period of transition from closed to open, or open to closed, is a gradual ramp over a period of time that is greater than the response time of phase-locked circuit 100, a frequency range supported by voltage controlled oscillator 300 may be shifted to either a higher frequency range or a lower frequency range, as needed, to accommodate environmentally induced frequency drift in voltage controlled oscillator 300. Operated in such a manner, an embodiment of phase-locked loop circuit 100 that incorporates example voltage controlled oscillator 300 may support a large frequency drift capability while maintaining a low Kvco, and without introducing noise or a discontinuity in the frequency of the generated VCO output signal ($F_{VCO}$).

Figure 4:
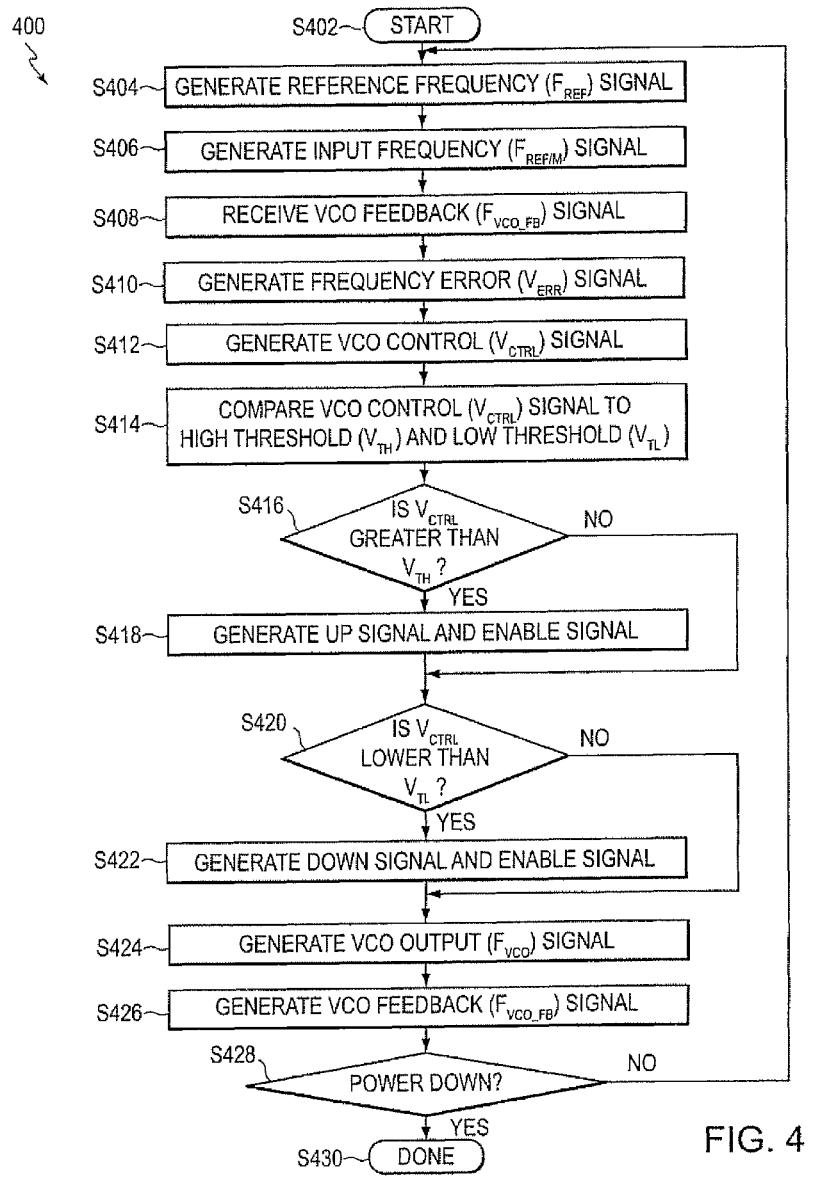
FIG. 4 shows a flow-chart of an example process that may be performed by the example phase-locked loop circuit of FIG. 1.

FIG. 4 shows a flow-chart of an example process 400 that may be performed by the example phase-locked loop circuit of FIG. 1 which includes an example VCO frequency compensation control unit and an example voltage controlled oscillator, as described above. As shown in FIG. 4, operation of process 400 begins at step S402 and proceeds to step S404.

In step S404, reference clock 102 may generate a clock reference signal ($F_{REF}$) that may be passed to reference signal frequency divider 104, and operation of the process continues to step S406.

In step S406, optional reference signal frequency divider 104 may divide the frequency of clock reference signal ($F_{REF}$) by a predetermined divider, e.g., M, to produce a reference input signal ($F_{REF/M}$) that may be passed to phase-frequency detector/charge pump 106, and operation of the process continues to step S408.

In step S408, phase-frequency detector/charge pump 106 may further receive VCO feedback signal ($F_{VCO\_FB}$), and operation of the process continues to step S410.

In step S410, phase-frequency detector/charge pump 106 may generate, and pass to loop filter 108, a frequency error signal ($V_{ERR}$), that may be representative in both, sign and scale to the frequency difference detected by phase-frequency detector/charge pump 106 between reference input signal ($F_{REF/M}$) and VCO feedback signal ($F_{VCO\_FB}$), and operation of the process continues to step S412.

In step S412, loop filter 108 may integrate/smooth the frequency error signal ($V_{ERR}$) to generate a smoothed VCO control signal ($V_{CTRL}$) that may be passed to voltage controlled oscillator 110, and operation of the process continues to step S414.

In step S414, comparison unit 109 may compare control signal ($V_{CTRL}$) to a low threshold voltage ($V_{TL}$) and may compare control signal ($V_{CTRL}$) to a high threshold voltage ($V_{TH}$), and operation of the process continues to step S416.

If, in step S416, comparison unit 109 determines that control signal ($V_{CTRL}$) is greater than high threshold voltage ($V_{TH}$), operation of the process continues to step S418, otherwise, operation of the process continues to step S420.

In step S418, comparison unit 109 may generate and may transmit to VCO frequency compensation control unit 114 an UP signal and an ENABLE signal, and operation of the process continues to step S420.

If, in step S420, comparison unit 109 determines that control signal ($V_{CTRL}$) is lower than low threshold voltage ($V_{TH}$), operation of the process continues to step S422, otherwise, operation of the process continues to step S424.

In step S422, comparison unit 109 may generate and may transmit to VCO frequency compensation control unit 114 a DOWN signal and an ENABLE signal, and operation of the process continues to step S424.

In step S424, voltage controlled oscillator 110 may generate VCO output signal ($F_{VCO}$) with a frequency that is proportional to VCO control signal ($V_{CTRL}$), and operation of the process continues to step S426.

In step S426, optional feedback signal frequency divider 112 may receive VCO output signal ($F_{VCO}$) and may divide the frequency of VCO output signal ($F_{VCO}$) by a predetermined divider, e.g., N, to produce VCO feedback signal ($F_{VCO\_FB}$) that may be passed to phase-frequency detector/charge pump 106, as described above, and operation of the process continues to step S428.

If, in step S428, a power-down or restart of the electronic device in which phase-locked loop circuit 100 is included is initiated, operation of the process continues to step S430 and the operation of the process terminates, otherwise, operation of the process continues to step S404.

Figure 5:
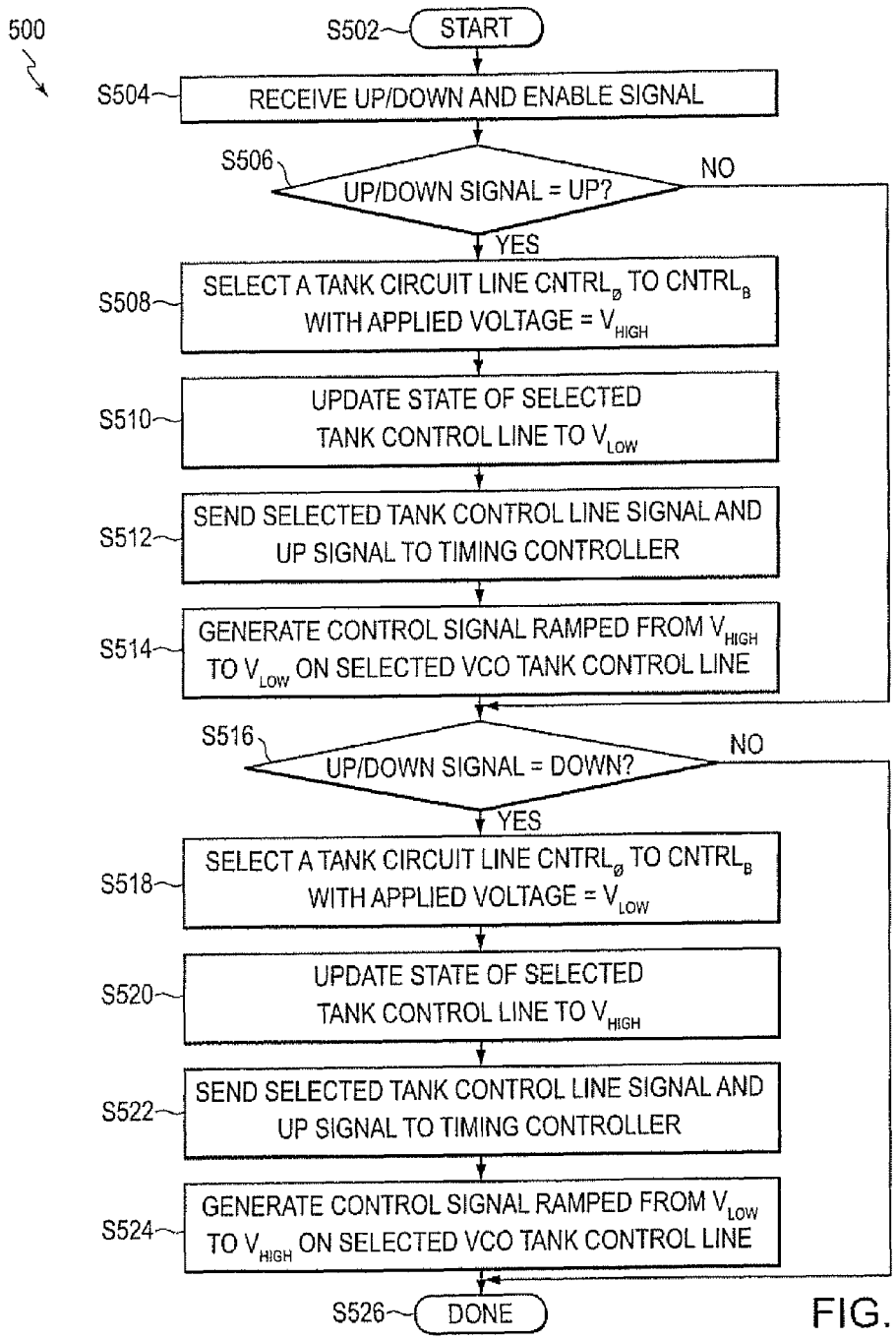
FIG. 5 shows a flow-chart of an example process that may be performed by an embodiment of the VCO frequency compensation control unit included in the example phase-locked loop circuit of FIG. 1.

FIG. 5 shows a flow-chart of an example process 500 that may be performed by an embodiment of the VCO frequency compensation control unit included in the example phase-locked loop circuit of FIG. 1, as described above. As shown in FIG. 5, operation of process 500 begins at step S502 and proceeds to step S504.

In step S504, comparison unit 109 may generate, based on a determined relationship of control signal ($V_{CTRL}$) with respect to low threshold voltage ($V_{TL}$) and high threshold voltage ($V_{TH}$), and may transmit to VCO frequency compensation control unit 114, an UP/DOWN signal and an ENABLE signal, and operation of the process continues to step S506.

If, in step S506, decoder unit 116, within VCO frequency compensation control unit 114, determines that an UP signal has been received, operation of the process continues to step S508, otherwise, operation of the process continues to step S516.

In step S508, decoder unit 116 may select a tank circuit control line, e.g., one of control lines $CNTRL_0$ though $CNTRL_B$, with a HIGH applied signal, based on control line status information contained in control line status unit 120, and operation of the process continues to step S510.

In step S510, decoder unit 116 may update the status of the selected control line in control line status unit 120 to LOW, and operation of the process continues to step S512.

In step S512, decoder unit 116 may pass the identity of the selected control line and the received UP signal to timing control unit 114, and operation of the process continues to step S514.

In step S514, timing control unit 114 may generate on the selected tank circuit control line, a control signal ramped from HIGH to LOW over a period of time greater than the response period of the phase-locked loop circuit, and operation of the process continues to step S516.

If, in step S516, decoder unit 116, within VCO frequency compensation control unit 114, determines that an DOWN signal has been received, operation of the process continues to step S518, otherwise, operation of the process continues to step S526 and terminates.

In step S518, decoder unit 116 may select a tank circuit control line, e.g., one of control lines $CNTRL_0$ though $CNTRL_B$, with a LOW applied signal, based on control line status information contained in control line status unit 120, and operation of the process continues to step S520.

In step S520, decoder unit 116 may update the status of the selected control line in control line status unit 120 to HIGH, and operation of the process continues to step S522.

In step S522, decoder unit 116 may pass the identity of the selected control line and the received DOWN signal to timing control unit 114, and operation of the process continues to step S524.

In step S524, timing control unit 114 may generate on the selected tank circuit control line, a control signal ramped from LOW to HIGH over a period of time greater than the response period of the phase-locked loop circuit, and operation of the process continues to step S526 and terminates.

It is noted that, in step S514 and step S524, above, the ramped signal applied by timing control unit 118 to a selected tank circuit control line may be any of a variety of signals, so long as the time-averaged capacitive transition from LOW to HIGH, or from HIGH to LOW, over the adjustment period, T_adj, is sufficiently gradual to avoid introducing noise and/or an operationally disruptive discontinuity in the frequency of the generated VCO output signal ($F_{VCO}$). For example, in a phase-locked circuit embodiments that includes a MIM/MOM capacitor based voltage controlled oscillator, any form of pulse width modulation, or other pseudo-random pulse staggering technique may be used that achieves such a sufficiently gradual time-averaged capacitive transition. In phase-locked circuit embodiments that include a varactor based voltage controlled oscillator, any form of continuous ramp signal or stepped ramp signal or pulsed ramp signal may be used that achieves such a sufficiently gradual time-averaged capacitive transition.

Figure 6:
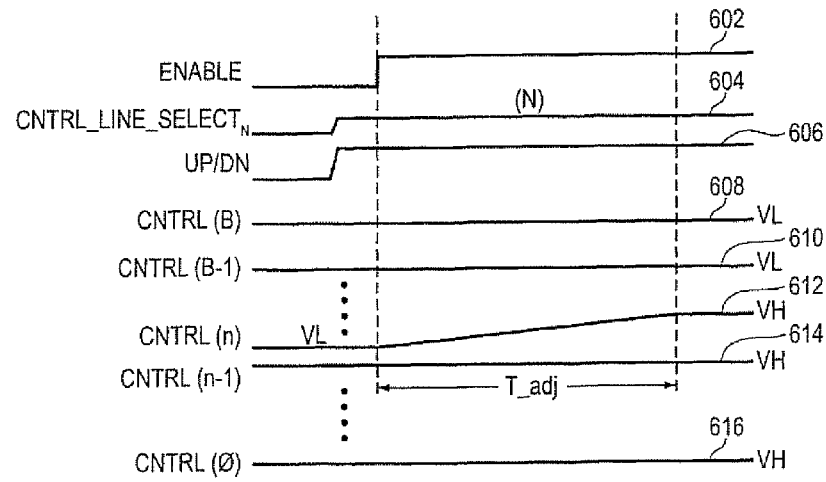
FIG. 6 shows plots of example control signals associated with operation of the example phase-locked loop circuit of FIG. 1 that includes a first embodiment of the VCO frequency compensation control unit.

FIG. 6 shows plots of example control signal values associated with operation of an example embodiment of a phase-locked loop circuit that includes an example VCO frequency compensation control unit, as described above with respect to FIG. 1, and an example varactor based voltage controlled oscillator, as described above with respect to FIG. 2. The example signal values presented in FIG. 6 are consistent with an execution of the process described above with respect to FIG. 5, in which comparison unit 109 generates, based on a determined relationship of control signal ($V_{CTRL}$) with respect to low threshold voltage ($V_{TL}$) and high threshold voltage ($V_{TH}$), and transmits to VCO frequency compensation control unit 114, a DOWN signal and an ENABLE signal.

For example, plot 602 may represent an example ENABLE signal transmitted from comparison unit 109 to decoder unit 116 of VCO frequency compensation control unit 114 to inform decoder unit 116 that a unit change of VCO frequency compensation has been requested by comparison unit 109.

Plot 604 may represent an example selection signal placed on a tank control line selection lead, $CNTRL\_LINE\_SELECT_N$, by decoder unit 116 to inform timing control unit 118 that tank control line $CNTRL_N$ of tank control lines $CNTRL_0$-$CNTRL_B$ has been selected by decoder unit 116 for applying a requested unit of VCO frequency compensation to voltage controlled oscillator 110.

Plot 606 may represent an example DOWN signal passed from comparison unit 109 to decoder unit 116 and from decoder unit 116 to timing control unit 118 to indicate that a unit decrease of VCO frequency compensation has been requested by comparison unit 109.

Plot 608, plot 610, plot 614 and plot 616 present example signals maintained by timing control unit 114 on tank control lines $CNTRL_B$, $CNTRL_{B-1}$, $CNTRL_{N-1}$, $CNTRL_0$, respectively. For example, plot 608 and plot 610, i.e., $CNTRL_B$, $CNTRL_{B-1}$, are maintained at a LOW state, whereas plot 614 and plot 616, i.e., $CNTRL_{N-1}$, $CNTRL_0$, are maintained at a HIGH state. As described above, the status of each tank control line may be maintained in control line status unit 120 and used by decoder 116 to select a tank control line for applying a requested unit of VCO frequency compensation.

Plot 612 presents an example ramped LOW to HIGH signal that may be placed on tank control line $CNTRL_N$ by timing control unit 114 in response to the example UP signal of plot 606 and the example $CNTRL\_LINE\_SELECT_N$ signal of plot 604. As described, above, by gradually adjusting the control signal applied to the selected tank circuit control line, $CNTRL_N$, over a period of time that is greater than the response time of phase-locked circuit 100, a frequency range supported by voltage controlled oscillator 200 may be shifted to either a higher frequency range or a lower frequency range, as needed, to accommodate environmentally induced frequency drift in voltage controlled oscillator 110. In this manner, phase-locked loop circuit 100 may support a large frequency drift capability while maintaining a low Kvco, and without introducing noise or a discontinuity in the frequency of the generated VCO output signal ($F_{VCO}$).

Figure 7:
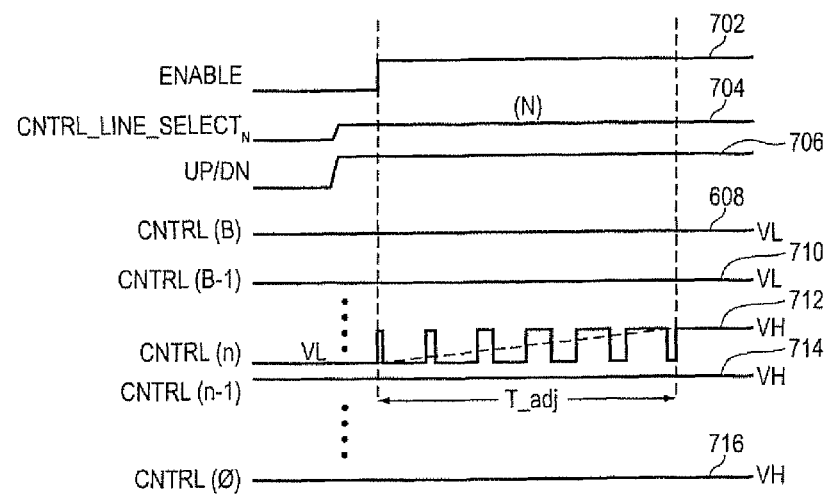
FIG. 7 shows plots of example control signals associated with operation of the example phase-locked loop circuit of FIG. 1 that includes a second embodiment of the VCO frequency compensation control unit.

FIG. 7 shows plots of example control signal values associated with operation of an example embodiment of a phase-locked loop circuit that includes an example VCO frequency compensation control unit, as described above with respect to FIG. 1, and an example MOM/MIM capacitor based voltage controlled oscillator, as described above with respect to FIG. 3. The example signal values presented in FIG. 7 are consistent with an execution of the process described above with respect to FIG. 5, in which comparison unit 109 generates, based on a determined relationship of control signal ($V_{CTRL}$) with respect to low threshold voltage ($V_{TL}$) and high threshold voltage ($V_{TH}$), and transmits to VCO frequency compensation control unit 114, an UP signal and an ENABLE signal.

Each of plot 702 through plot 710, plot 714 and plot 716, shown in FIG. 7, is similar in content and nature to plot 602 through plot 610, plot 614 and plot 616 described above with respect to FIG. 6, and, therefore will not again be described. However, plot 712 presents an example pulse-width modulated ramped LOW to HIGH signal that may be placed on tank control line $CNTRL_N$ by timing control unit 114 in response to the example DOWN signal of plot 706 and the example $CNTRL\_LINE\_SELECT_N$ signal of plot 704. Such a signal applied to a tank circuit control line of a MOM/MIM capacitor based voltage controlled oscillator, as described above with respect to FIG. 3, may result in a time averaged ramp of the capacitive load added to the based voltage controlled oscillator LC tank circuit.

As described, above, by adjusting the time-averaged change in capacitive load applied to a voltage controlled oscillator tank circuit in a ramped manner over a period of time that is greater than the response time of phase-locked circuit 100, a frequency range supported by voltage controlled oscillator 300 may be shifted to either a higher frequency range or a lower frequency range, as needed, to accommodate environmentally induced frequency drift in the voltage controlled oscillator. In this manner, phase-locked loop circuit 100 may support a large frequency drift capability while maintaining a low Kvco, and without introducing noise or a discontinuity in the frequency of the generated VCO output signal ($F_{VCO}$).

A major difference between voltage controlled oscillator 300, described with respect to FIG. 3, and voltage controlled oscillator 200, described with respect to FIG. 2, is the impact of the use of MOM/MIM capacitors and an open/close switch in the capacitive circuit branches of voltage controlled oscillator 300, in place of the variable controllable varactors used in voltage controlled oscillator 200. For example, by closing a capacitive branch in-series transistor, the capacitance of the branch is suddenly added to the circuit. Such a sudden change in the capacitance of LC tank circuit 302, if left uncorrected, may introduce noise and/or an operationally disruptive discontinuity in the frequency of the generated VCO output signal ($F_{VCO}$).

However, by configuring timing control unit 118 to apply a VCO frequency control signal to a selected VCO frequency control signal line, $CNTRL_N$, in, for example, a pulse-modulated manner, as shown in plot 712, the time averaged increase in LC tank capacitance, during the period of transition, i.e., T_adj, as shown in FIG. 7, is a gradual ramp over a period of time that is greater than the response time of phase-locked circuit 100. As described above with respect to operation of voltage controlled oscillator 300, a frequency range supported by voltage controlled oscillator 300 may be shifted to either a higher frequency range or a lower frequency range, as needed, to accommodate environmentally induced frequency drift in voltage controlled oscillator 300. In this manner, phase-locked loop circuit 100 that incorporates example voltage controlled oscillator 300 may support a large frequency drift capability while maintaining a low Kvco, and without introducing noise or a discontinuity in the frequency of the generated VCO output signal ($F_{VCO}$).

It is noted that, in a set of plots similar to those presented in FIG. 6 and FIG. 7, depicting implementation of a unit decrease in the capacitance of a voltage controlled oscillator LC tank circuit, the value of the UP/DOWN signal shown in plots corresponding to plot 606 and plot 706 would show a LOW value for the duration of the adjustment period, T_adj. It is further noted that plots corresponding to plot 612 and plot 712 representing a signal applied by timing control unit to selected LC tank circuit control line $CNTRL_N$ would ramp from a HIGH signal value to a low signal value for the duration of the adjustment period, T_adj. Other signals corresponding to those presented in FIG. 6 and FIG. 7, may remain the same as shown in FIG. 6 and FIG. 7.

It is noted that, in phase-locked circuit embodiments that include a MIM/MOM capacitor based voltage controlled oscillator, any form of pulse width modulation, or other pseudo-random pulse staggering technique may be used, so long as the time-averaged capacitive transition from LOW to HIGH, or from HIGH to LOW, over the adjustment period, T_adj, is sufficiently gradual to avoid introducing noise and/or an operationally disruptive discontinuity in the frequency of the generated VCO output signal ($F_{VCO}$).

For purposes of explanation in the above description, numerous specific details are set forth in order to provide a thorough understanding of the described low Kvco phase-locked loop with large frequency drift handling capability. It will be apparent, however, to one skilled in the art that the described low Kvco phase-locked loop with large frequency drift handling capability may be practiced without these specific details. In other instances, well-known structures and devices are shown in block diagram form in order to avoid obscuring the features of the described low Kvco phase-locked loop with large frequency drift handling capability.

While the low Kvco phase-locked loop with large frequency drift handling capability has been described in conjunction with the specific embodiments thereof, it is evident that many alternatives, modifications, and variations will be apparent to those skilled in the art. Accordingly, embodiments of the low Kvco phase-locked loop with large frequency drift handling capability, as set forth herein, are intended to be illustrative, not limiting. There are changes that may be made without departing from the spirit and scope of the invention.

What is claimed is:

1. A phase-locked loop circuit, comprising:
   a VCO frequency compensation control unit that generates a VCO frequency adjustment signal based on a measure of frequency difference between a reference signal and a VCO feedback signal; and
   a VCO that receives the VCO frequency adjustment signal and adjusts a frequency of a signal generated by the VCO based on the received VCO frequency adjustment signal,
   wherein the VCO frequency adjustment signal is ramped over an adjustment period that is greater than a response time of the phase-locked loop circuit.

2. The phase-locked loop circuit of claim 1, wherein the VCO frequency compensation control unit comprises:
   a decoder unit that receives the measure of frequency difference and selects a VCO frequency adjustment control line on which the VCO frequency adjustment signal is applied; and
   a timing control unit that generates the ramped VCO frequency adjustment signal placed on the selected VCO frequency adjustment control line.

3. The phase-locked loop circuit of claim 2, wherein the decoder unit includes a VCO frequency adjustment control line status unit that maintains an indicator of a signal value maintained by the timing control unit on each VCO frequency adjustment control line.

4. The phase-locked loop circuit of claim 3, wherein the decoder unit selects a VCO frequency adjustment control line based on the measure of frequency difference and a status of each VCO frequency adjustment control line stored in the VCO frequency adjustment control line status unit.

5. The phase-locked loop circuit of claim 1, wherein the VCO comprises:
   an LC tank circuit that receives the VCO frequency adjustment signal and adjusts an effective capacitance of the LC tank circuit based on the received VCO frequency adjustment signal.

6. The phase-locked loop circuit of claim 5, wherein the LC tank circuit includes a capacitive branch that is enabled and disabled based on a VCO frequency adjustment signal received on a VCO frequency adjustment control line connected to the capacitive branch.

7. The phase-locked loop circuit of claim 5, wherein the LC tank circuit includes a capacitive branch that is enabled and disabled by a switch element based on a VCO frequency adjustment signal received on a VCO frequency adjustment control line connected to a gate of the switch element.

8. The phase-locked loop circuit of claim 5, wherein the LC tank circuit includes one of a varactor, a metal insulator metal capacitor and a metal oxide metal capacitor.

9. The phase-locked loop circuit of claim 1, wherein the VCO frequency adjustment signal is one of a continuous ramped signal from a first value to a second value and a pulse width modulated signal that produces a time-averaged ramp from a first value to a second value.

10. The phase-locked loop circuit of claim 1, wherein a phase-frequency detector generates, based on the measure of frequency difference, one of an UP signal and a DOWN signal that is passed to the VCO frequency compensation control unit.

11. The phase-locked loop circuit of claim 10, wherein the VCO frequency adjustment signal is ramped from one of LOW to HIGH and HIGH to LOW, based on the received UP/DOWN signal.

12. A method of adjusting a frequency of a signal generated by a VCO in a phase-locked loop, comprising:
generating a VCO frequency adjustment signal based on a reference signal and a VCO feedback signal; and
adjusting the frequency of the signal generated by the VCO based on the VCO frequency adjustment signal,
wherein the VCO frequency adjustment signal is ramped over an adjustment period that is greater than a response time of a phase-locked loop circuit.

13. The method of claim 12, further comprising:
selecting a VCO frequency adjustment control line on which the VCO frequency adjustment signal is applied based on a generated measure of frequency difference; and
generating the ramped VCO frequency adjustment signal placed on the selected VCO frequency adjustment control line.

14. The method of claim 13, further comprising
maintaining an indicator of a signal value maintained on each VCO frequency adjustment control line.

15. The method of claim 14, further comprising:
selecting a VCO frequency adjustment control line based on the measure of frequency difference and the indicator of the signal value maintained on each VCO frequency adjustment control line.

16. The method of claim 12, wherein adjusting the frequency of the signal generated by the VCO comprises:
receiving the VCO frequency adjustment signal and adjusting an effective capacitance of an LC tank circuit within the VCO based on the received VCO frequency adjustment signal.

17. The method of claim 16, further comprising:
one of enabling and disabling a capacitive branch in the LC tank circuit based on a VCO frequency adjustment signal received on a VCO frequency adjustment control line connected to the capacitive branch.

18. The method of claim 12, further comprising:
generating one of an UP signal and a DOWN signal based on a measure of frequency difference and passing one of the UP signal and the DOWN signal to a VCO frequency compensation control unit.

19. The method of claim 18, wherein the VCO frequency adjustment signal is ramped from one of LOW to HIGH and HIGH to LOW, based on the received UP/DOWN signal.

20. A method of increasing a range of frequency drift in a VCO that is corrected by a phase-locked loop circuit containing the VCO, comprising:
generating a measure of frequency difference between a reference signal and a VCO feedback signal;
generating a VCO frequency adjustment signal based on the measure of frequency difference; and
adjusting a capacitance of an LC tank circuit within the VCO based on the VCO frequency adjustment signal,
wherein the VCO frequency adjustment signal is ramped over an adjustment period that is greater than a response time of the phase-locked loop circuit.

* * * * *